(12) United States Patent
Wirth

(10) Patent No.: US 9,398,664 B2
(45) Date of Patent: Jul. 19, 2016

(54) OPTOELECTRONIC DEVICE THAT EMITS MIXED LIGHT

(75) Inventor: Ralph Wirth, Mintraching-Auhof (DE)

(73) Assignee: OSRAM Opto Semiconductors GmbH (DE)

(*) Notice: Subject to any disclaimer, the term of this patent is extended or adjusted under 35 U.S.C. 154(b) by 0 days.

(21) Appl. No.: 13/128,472

(22) PCT Filed: Nov. 13, 2009

(86) PCT No.: PCT/DE2009/001626
§ 371 (c)(1),
(2), (4) Date: Aug. 8, 2011

(87) PCT Pub. No.: WO2010/054650
PCT Pub. Date: May 20, 2010

(65) Prior Publication Data
US 2011/0291129 A1  Dec. 1, 2011

(30) Foreign Application Priority Data
Nov. 14, 2008  (DE) .......................... 10 2008 057 347

(51) Int. Cl.
*H01L 33/00* (2010.01)
*H05B 33/08* (2006.01)

(52) U.S. Cl.
CPC .... *H05B 33/0857* (2013.01); *H01L 2924/0002* (2013.01)

(58) Field of Classification Search
CPC ............ H05B 33/0857; H01L 2924/00; H01L 2924/0002
USPC .................................. 257/88, 89, 90, 94, 96
See application file for complete search history.

(56) References Cited

U.S. PATENT DOCUMENTS 3,705,316 A * 12/1972 Burrous .................... H03F 1/30
250/205
4,298,869 A * 11/1981 Okuno ........................... 345/82
(Continued)

FOREIGN PATENT DOCUMENTS

CA  2171244  9/1996
CN  2696134 Y  4/2005
(Continued)

OTHER PUBLICATIONS

Mroczka, "Temperature stabilisation of light-emitting diode radiation", Journal of Physics E: Scientific Instrument 21 (1988) pp. 306-309.*

(Continued)

*Primary Examiner* — Jay C Kim
(74) *Attorney, Agent, or Firm* — DLA Piper LLP (US)

(57) ABSTRACT

An optoelectronic device includes a first semiconductor light source having a first light-emitting diode; a second semiconductor light source having a second light-emitting diode; and a resistance element having a temperature-dependent electrical resistance, wherein a first wavelength and/or a first intensity of light emitted by the first semiconductor light source have/has a first temperature dependence, and the second wavelength range and/or the second intensity of the fight emitted by the second semiconductor light source have/has a second temperature dependence different from the first temperature dependence, the resistance element and the first semiconductor light source form a series circuit, and the series circuit and the second semiconductor light source form a parallel circuit.

19 Claims, 10 Drawing Sheets

(56) References Cited

U.S. PATENT DOCUMENTS

| | | | | |
|---|---|---|---|---|
| 4,939,426 A * | 7/1990 | Menard | H05B 33/0821 | 315/185 R |
| 5,463,280 A * | 10/1995 | Johnson | F21K 9/135 | 315/187 |
| 5,598,068 A * | 1/1997 | Shirai | H05B 33/0827 | 315/160 |
| 5,708,277 A * | 1/1998 | Murayama | H01L 31/167 | 250/551 |
| 5,783,909 A * | 7/1998 | Hochstein | H05B 33/0818 | 315/158 |
| 5,803,579 A * | 9/1998 | Turnbull | B60L 1/14 | 257/E25.02 |
| 6,069,452 A * | 5/2000 | Rossner | H05B 37/036 | 315/135 |
| 6,149,283 A * | 11/2000 | Conway et al. | | 362/236 |
| 6,191,541 B1 * | 2/2001 | Patel | H05B 33/0854 | 315/307 |
| 6,288,497 B1 * | 9/2001 | Chang | H05B 33/0803 | 315/185 R |
| 6,351,079 B1 * | 2/2002 | Willis | H05B 33/0803 | 315/200 A |
| 6,411,045 B1 * | 6/2002 | Nerone | H02M 7/538 | 315/185 R |
| 6,441,558 B1 * | 8/2002 | Muthu | H05B 33/0863 | 315/118 |
| 6,531,826 B1 * | 3/2003 | Ohno | B41J 2/45 | 315/169.3 |
| 6,540,377 B1 * | 4/2003 | Ota et al. | | 362/231 |
| 6,548,967 B1 * | 4/2003 | Dowling | G06Q 30/0201 | 315/307 |
| 6,577,080 B2 * | 6/2003 | Lys | H05B 33/0857 | 315/292 |
| 6,693,394 B1 * | 2/2004 | Guo | H05B 33/0854 | 315/158 |
| 6,831,679 B1 * | 12/2004 | Olsson | G01N 21/954 | 348/241 |
| 6,956,337 B2 * | 10/2005 | Kemper | G01K 1/02 | 315/307 |
| 6,963,175 B2 * | 11/2005 | Archenhold | H05B 33/0818 | 315/246 |
| 7,005,679 B2 * | 2/2006 | Tarsa et al. | | 257/89 |
| 7,053,560 B1 * | 5/2006 | Ng | H05B 33/0803 | 315/185 R |
| 7,055,986 B2 * | 6/2006 | Littleton | G01J 1/08 | 362/231 |
| 7,148,632 B2 * | 12/2006 | Berman | H05B 33/0803 | 315/189 |
| 7,183,727 B2 * | 2/2007 | Ferguson | H05B 41/3922 | 315/149 |
| 7,202,608 B2 * | 4/2007 | Robinson | H05B 33/0815 | 315/224 |
| 7,213,940 B1 * | 5/2007 | Van De Ven | F21K 9/00 | 257/89 |
| 7,221,044 B2 * | 5/2007 | Fan | H01L 27/153 | 257/676 |
| 7,264,381 B2 * | 9/2007 | Liu | H01L 25/0753 | 257/81 |
| 7,319,298 B2 * | 1/2008 | Jungwirth | H05B 33/086 | 250/216 |
| 7,352,339 B2 * | 4/2008 | Morgan | F24C 7/004 | 340/815.68 |
| 7,439,549 B2 * | 10/2008 | Marchl | H01L 25/0753 | 257/706 |
| 7,489,086 B2 * | 2/2009 | Miskin | H05B 33/0818 | 315/185 R |
| 7,561,610 B2 * | 7/2009 | Inoue | H01S 5/02212 | 257/81 |
| 7,687,816 B2 * | 3/2010 | Dias | H01L 33/504 | 257/98 |
| 7,695,151 B2 * | 4/2010 | Chen | H01L 25/0753 | 362/231 |
| 7,701,151 B2 * | 4/2010 | Petrucci | H05B 33/08 | 315/185 S |
| 7,718,942 B2 * | 5/2010 | Lim | H05B 33/0869 | 250/205 |
| 7,728,346 B2 * | 6/2010 | Takikawa | F21K 9/00 | 257/95 |
| 7,728,808 B2 * | 6/2010 | Kim | G09G 3/3413 | 315/169.3 |
| 7,828,460 B2 * | 11/2010 | Van De Ven | F21K 9/00 | 257/89 |
| 7,847,486 B2 * | 12/2010 | Ng | H05B 33/0812 | 315/119 |
| 7,850,358 B2 * | 12/2010 | Hamada | G02B 6/0068 | 362/225 |
| 7,863,829 B2 * | 1/2011 | Sayers | G06Q 50/06 | 315/153 |
| 7,990,360 B2 * | 8/2011 | Song | G09G 3/3413 | 315/308 |
| 8,013,533 B2 * | 9/2011 | De Rijck | H05B 33/0818 | 315/149 |
| 8,044,612 B2 * | 10/2011 | Prendergast | H05B 33/0818 | 315/297 |
| 8,100,552 B2 * | 1/2012 | Spero | | 362/231 |
| 8,174,205 B2 * | 5/2012 | Myers | F21K 9/00 | 315/158 |
| 8,179,055 B2 * | 5/2012 | Miskin | H05B 33/0803 | 315/185 R |
| 8,188,670 B2 * | 5/2012 | Yasuda | H05B 33/0803 | 315/160 |
| 8,198,834 B2 * | 6/2012 | Maruyama | H05B 33/0812 | 315/112 |
| 8,350,500 B2 * | 1/2013 | Negley | H05B 33/0872 | 315/291 |
| 8,358,085 B2 * | 1/2013 | Catalano | G01K 7/01 | 315/185 R |
| 8,385,735 B2 * | 2/2013 | Awazu | G03B 15/02 | 396/164 |
| 8,410,720 B2 * | 4/2013 | Holec | F21V 23/005 | 315/209 R |
| 8,521,035 B2 * | 8/2013 | Knapp | H04L 12/43 | 315/158 |
| 8,525,952 B2 * | 9/2013 | Tanaka | G09G 3/3413 | 349/69 |
| 8,558,249 B1 * | 10/2013 | Shum | H01L 25/0753 | 257/100 |
| 8,593,481 B2 * | 11/2013 | Morgenbrod | H05B 33/086 | 345/211 |
| 8,708,560 B2 * | 4/2014 | Kraemer | H05B 33/0803 | 250/494.1 |
| 8,742,686 B2 * | 6/2014 | Zampini, II | H05B 33/0857 | 257/13 |
| 8,884,521 B2 * | 11/2014 | Behr | B60Q 1/0023 | 315/158 |
| 8,890,419 B2 * | 11/2014 | Stack | H05B 33/0809 | 315/185 R |
| 9,084,314 B2 * | 7/2015 | Conover | H05B 37/029 | |
| 9,084,328 B2 * | 7/2015 | Negley | F21K 9/00 | |
| 2002/0070681 A1 | 6/2002 | Shimizu et al. | | 315/246 |
| 2002/0139987 A1 * | 10/2002 | Collins, III | H01L 27/153 | 257/88 |
| 2004/0027481 A1 * | 2/2004 | Asai | H04N 5/2256 | 348/372 |
| 2005/0174065 A1 * | 8/2005 | Janning | H05B 33/0803 | 315/185 S |
| 2005/0185113 A1 | 8/2005 | Weindorf et al. | | |
| 2005/0279949 A1 * | 12/2005 | Oldham | F21K 9/00 | 250/458.1 |
| 2006/0163589 A1 * | 7/2006 | Fan | H01L 27/153 | 257/88 |
| 2006/0202915 A1 * | 9/2006 | Chikugawa | H05B 33/0818 | 345/46 |
| 2006/0221637 A1 * | 10/2006 | Chikugawa | H05B 33/0818 | 362/612 |
| 2006/0238130 A1 * | 10/2006 | Hosoya | H04N 5/23241 | 315/86 |
| 2006/0245174 A1 * | 11/2006 | Ashdown | H05B 33/0818 | 362/85 |
| 2006/0274540 A1 * | 12/2006 | Klaver | B60Q 3/0293 | 362/479 |
| 2007/0018594 A1 * | 1/2007 | Janning | H05B 39/105 | 315/312 |
| 2007/0064421 A1 * | 3/2007 | Baba | G02B 6/0068 | 362/231 |

(56) References Cited

U.S. PATENT DOCUMENTS

| | | | |
|---|---|---|---|
| 2007/0171159 A1 | 7/2007 | Lee | |
| 2008/0054814 A1* | 3/2008 | Deppe | H05B 33/0803 315/192 |
| 2008/0061717 A1 | 3/2008 | Bogner et al. | |
| 2008/0079371 A1* | 4/2008 | Kang | H05B 33/0818 315/309 |
| 2008/0111505 A1 | 5/2008 | Wang et al. | |
| 2008/0128718 A1* | 6/2008 | Sumitani | H01L 25/0753 257/89 |
| 2008/0143275 A1 | 6/2008 | Hoffman | |
| 2008/0180044 A1* | 7/2008 | Li | H05B 33/0821 315/311 |
| 2008/0203405 A1* | 8/2008 | Rooymans | 257/91 |
| 2008/0215279 A1* | 9/2008 | Salsbury | H05B 33/0869 702/107 |
| 2008/0278928 A1* | 11/2008 | Van De Ven | F21K 9/00 362/84 |
| 2009/0013570 A1* | 1/2009 | Grajcar | G09F 9/33 40/552 |
| 2009/0085503 A1* | 4/2009 | Narita | H05B 33/089 315/309 |
| 2009/0121777 A1* | 5/2009 | Nakajima | H01L 25/167 327/493 |
| 2010/0060175 A1* | 3/2010 | Lethellier | H05B 33/0815 315/164 |
| 2010/0259182 A1* | 10/2010 | Man | H05B 33/0863 315/250 |
| 2011/0068696 A1* | 3/2011 | van de Ven | H05B 33/083 315/152 |
| 2011/0068701 A1* | 3/2011 | van de Ven | H05B 33/083 315/185 R |
| 2011/0068702 A1* | 3/2011 | van de Ven | H05B 33/0854 315/186 |
| 2011/0273102 A1* | 11/2011 | van de Ven | H05B 33/0809 315/193 |

FOREIGN PATENT DOCUMENTS

| | | | |
|---|---|---|---|
| CN | 101009080 | | 8/2007 |
| DE | 199 33 735 | | 2/2001 |
| DE | 20 2004 000 641 | | 5/2004 |
| EP | 1 950 490 | | 7/2008 |
| JP | 05-109504 | | 4/1993 |
| JP | 2002-8904 | | 1/2002 |
| JP | 2007-214603 | | 8/2007 |
| WO | 2004/047498 | | 6/2004 |
| WO | 2007/060570 | A1 | 5/2007 |
| WO | 2008/077099 | | 6/2008 |
| WO | WO 2008/084771 | * | 7/2008 ............. H01L 33/00 |

OTHER PUBLICATIONS

Data Sheet: Circuit Protection Thermistors, Part No. NT05 25311, Aug. 12, 2002, Ametherm, Inc., Carson City, NV, pp. 102.
English translation of the Chinese Search Report dated Mar. 28, 2014 from corresponding Chinese Application No. 20098014076.2.
English translation of the Chinese Notification of the Third Office Action dated Sep. 26, 2014 from corresponding Chinese Application No. 20098014076.2.
English translation of Korean Office Action dated Oct. 13, 2015 of corresponding Korean Patent Application No. 10-2010-7013398.
English translation of Korean Office Action dated Apr. 21, 2016 of corresponding Korean Application No. 10-2011-7013398.

* cited by examiner

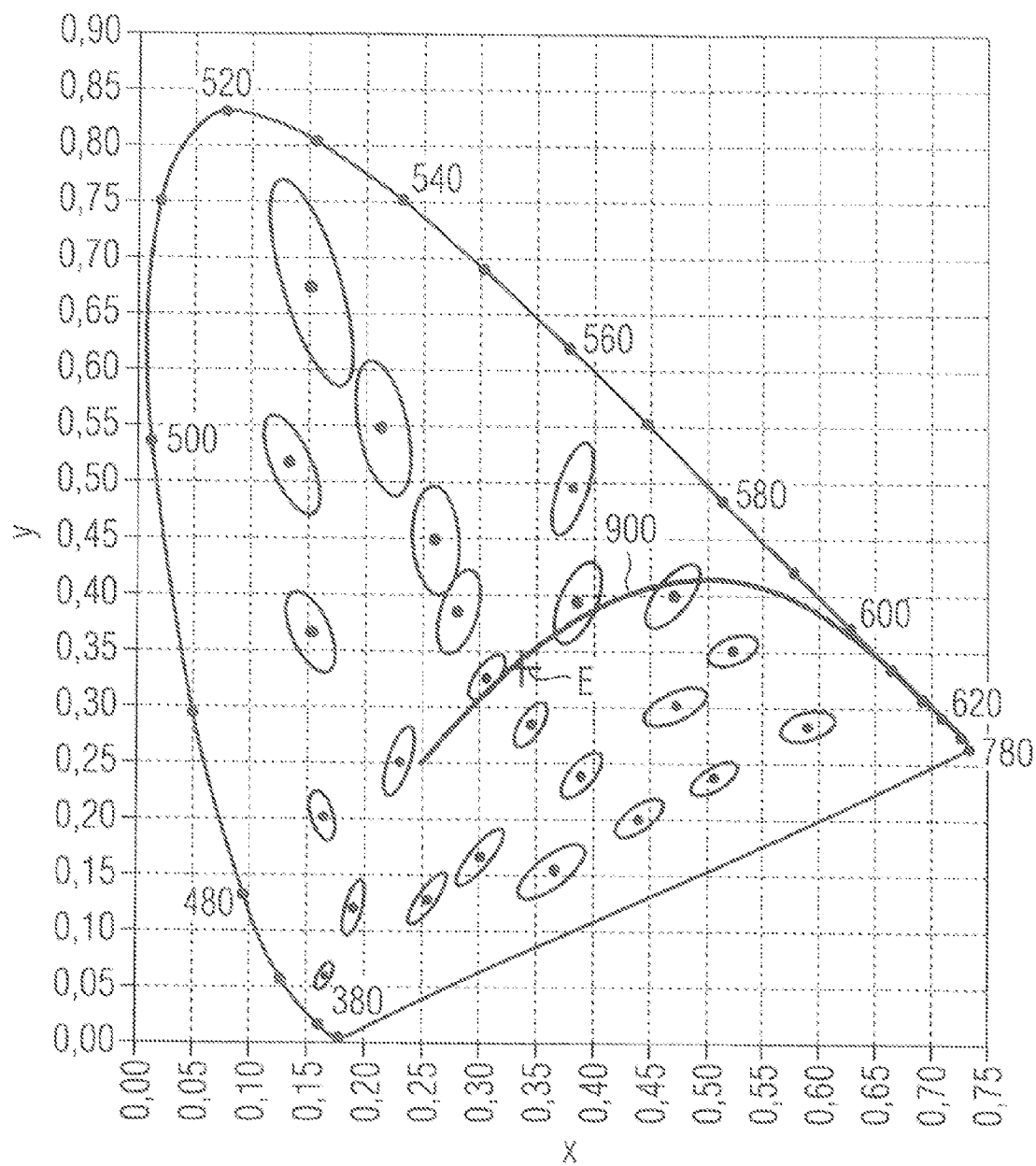

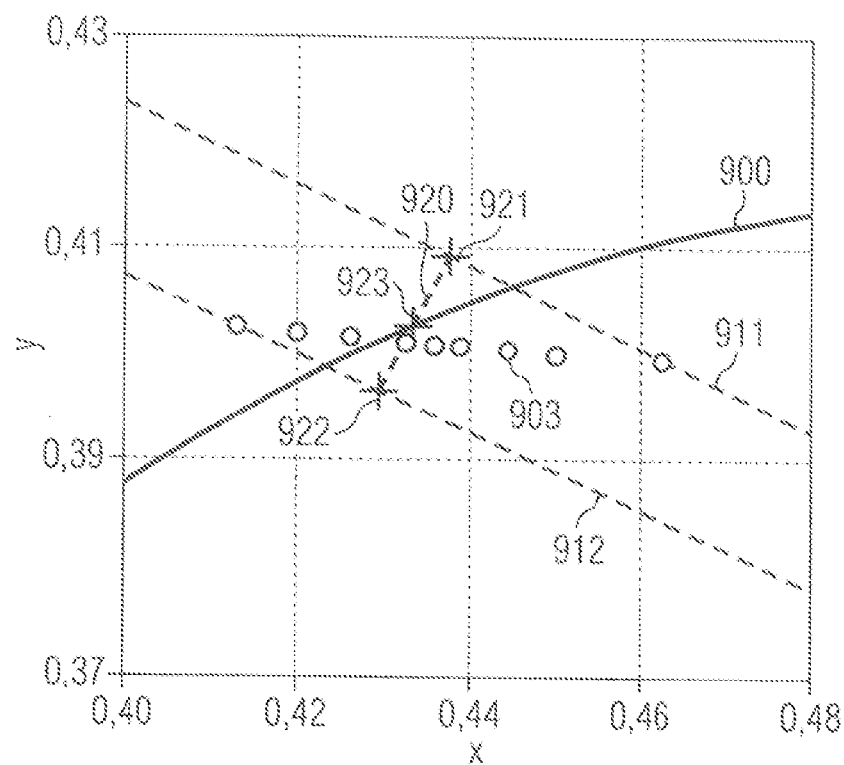
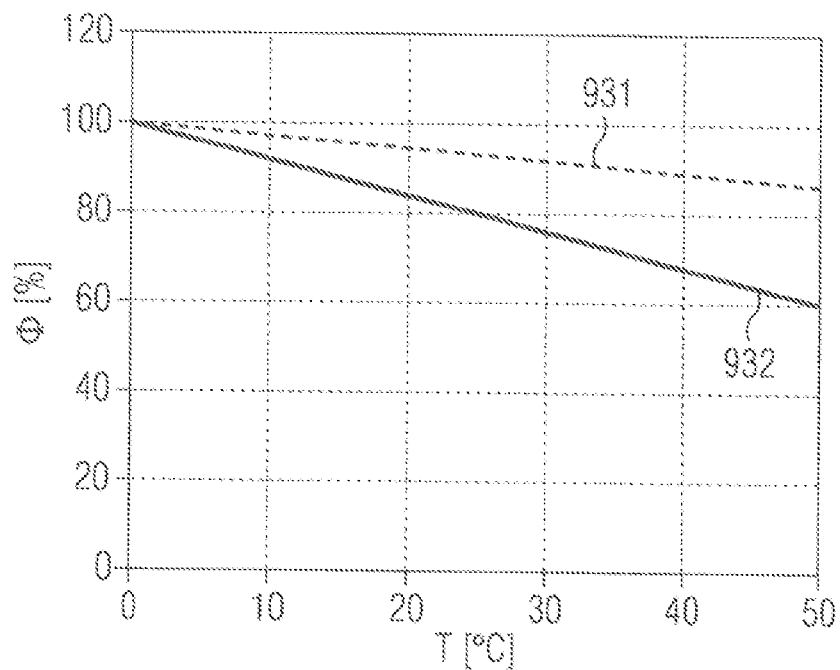

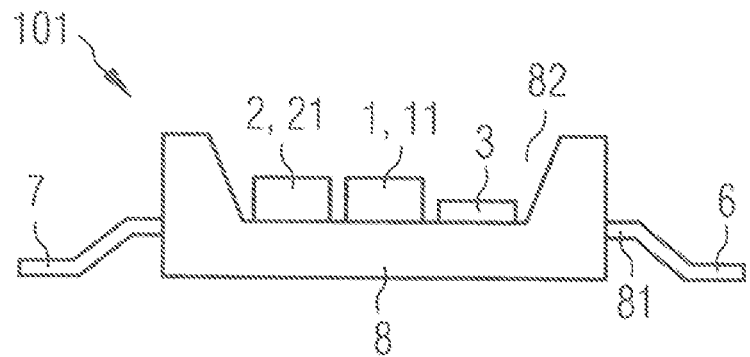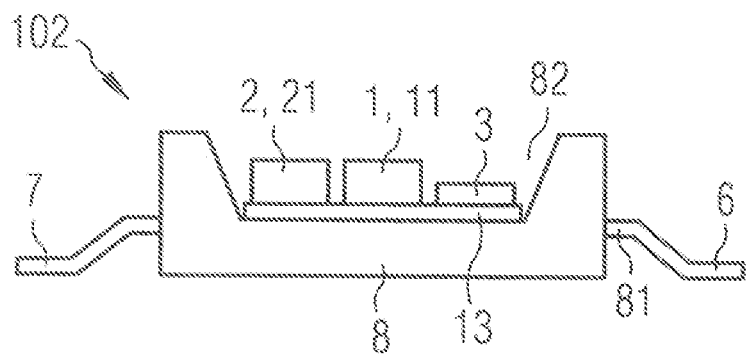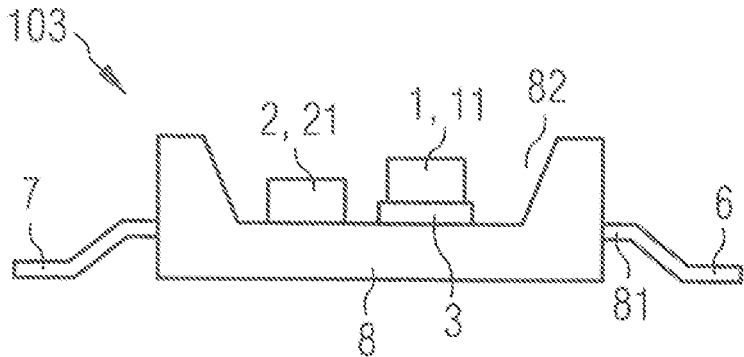

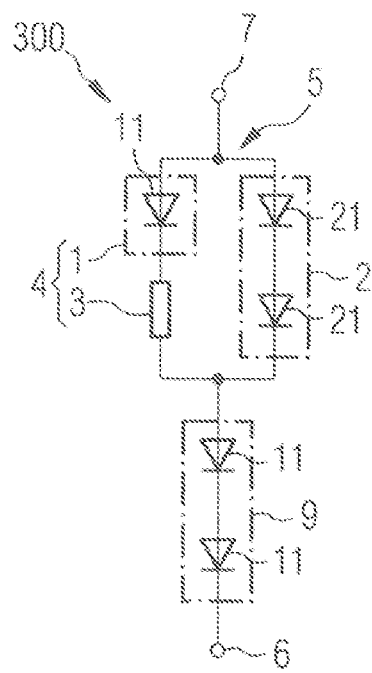
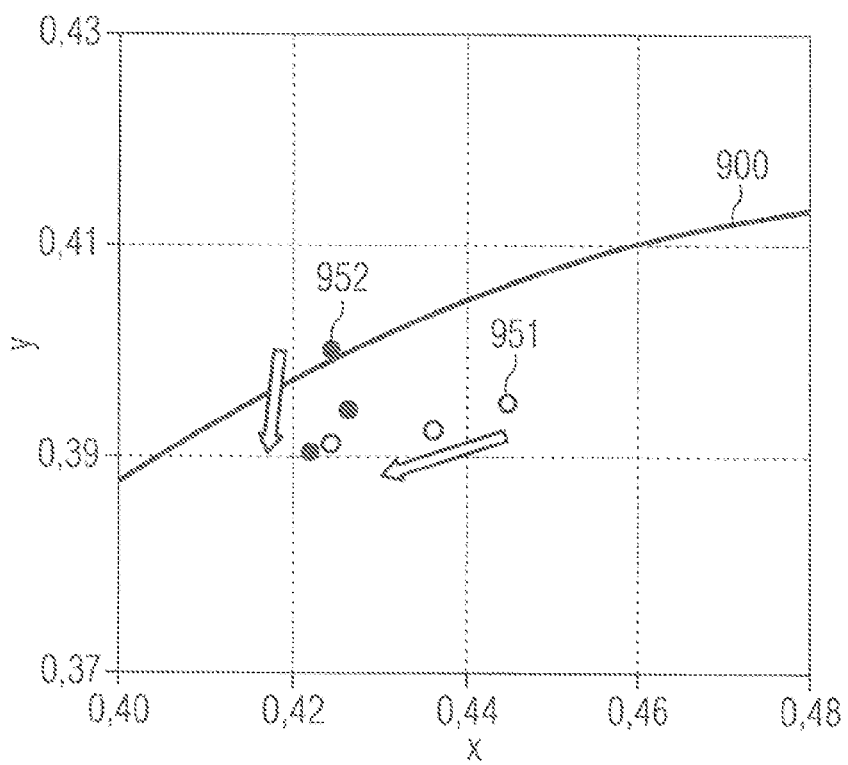

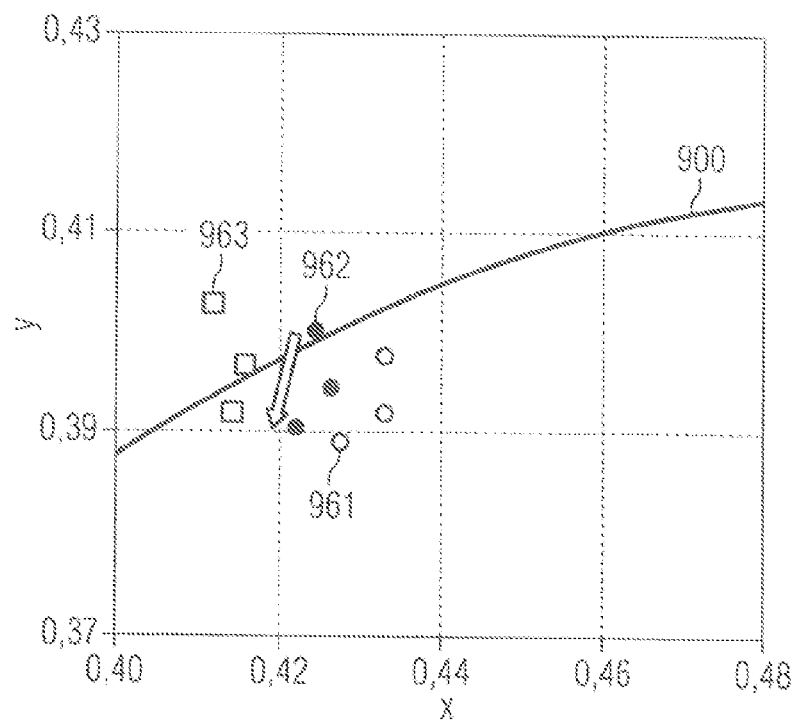
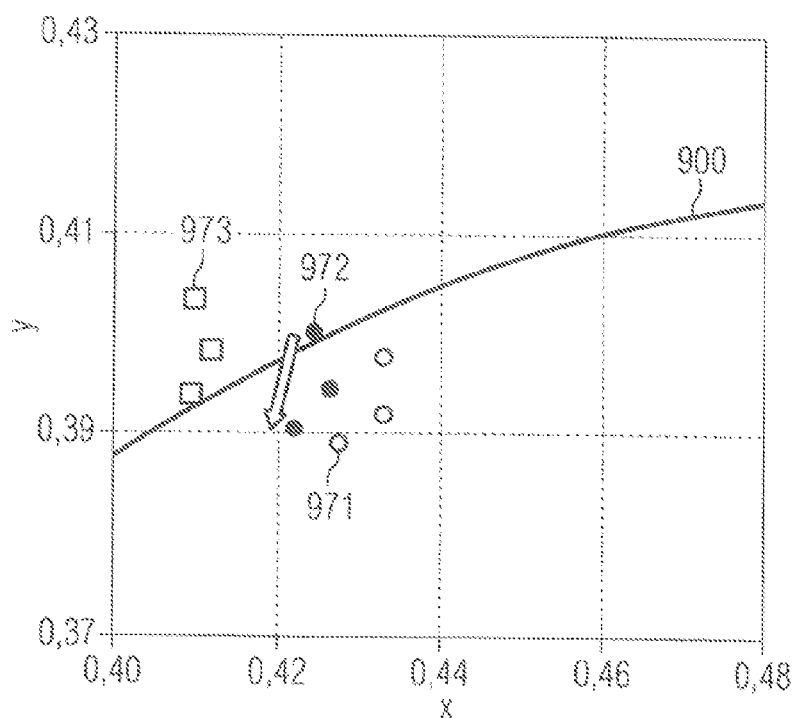

OPTOELECTRONIC DEVICE THAT EMITS MIXED LIGHT

RELATED APPLICATIONS

This is a §371 of International Application No. PCT/DE2009/001626, with an international filing date of Nov. 13, 2009, which is based on German Patent Application No. 10 2008 057 347.7, filed Nov. 14, 2008, the subject matter of which is incorporated by reference.

TECHNICAL FIELD

This disclosure relates to an optoelectronic device for emitting a mixed light.

BACKGROUND

To generate mixed light, that is to say non-monochromatic light and in this case, for example, white light, with the use of light-emitting diodes (LEDs), LEDs that emit in different colors and/or a plurality of phosphors are usually used. To generate white light, for example, spectral components in the yellow-green and in the red wavelength range which are emitted by different LEDs can be superimposed. What is challenging here, however, besides fulfilling optical stipulations such as, for instance, mixing light emitted by different LED chips, is stabilization of the color locus, for instance in the case of white light of the white point, with respect to temperature. This is due, for example, to different temperature dependencies of the chip technologies involved. Control to a single color locus is usually possible only using at least three different LEDs, for instance, to generate white mixed light by one LED that emits yellow-green, one LED that emits red and additionally one LED that emits blue.

It could therefore be helpful to provide an optoelectronic device that emits light comprising a first and a second semiconductor light source.

SUMMARY

I provide an optoelectronic device that emits mixed light including light in a first and a second wavelength range, including a first semiconductor light source having a first light-emitting diode, which during operation emits light in the first wavelength range with a first intensity; a second semiconductor light source having a second light-emitting diode, which during operation emits light in the second wavelength range with a second intensity, wherein the first and second wavelength ranges are different from one another; and a resistance element having a temperature-dependent electrical resistance, wherein the first wavelength and/or the first intensity of the light emitted by the first semiconductor light source have/has a first temperature dependence, and the second wavelength range and/or the second intensity of the light emitted by the second semiconductor light source have/has a second temperature dependence, which is different from the first temperature dependence, the resistance element and the first semiconductor light source form a series circuit, and the series circuit and the second semiconductor light source form a parallel circuit.

BRIEF DESCRIPTION OF THE DRAWINGS

FIGS. 1A to 2 show schematic illustrations of the CIE standard chromaticity diagram.

FIGS. 3A and 3B show graphs of temperature dependencies of first and second LEDs.

FIGS. 4 to 11 show schematic illustrations of other examples of optoelectronic devices.

FIGS. 12 to 14 show graphs with simulations concerning control properties of optoelectronic devices.

DETAILED DESCRIPTION

Figure 1A:
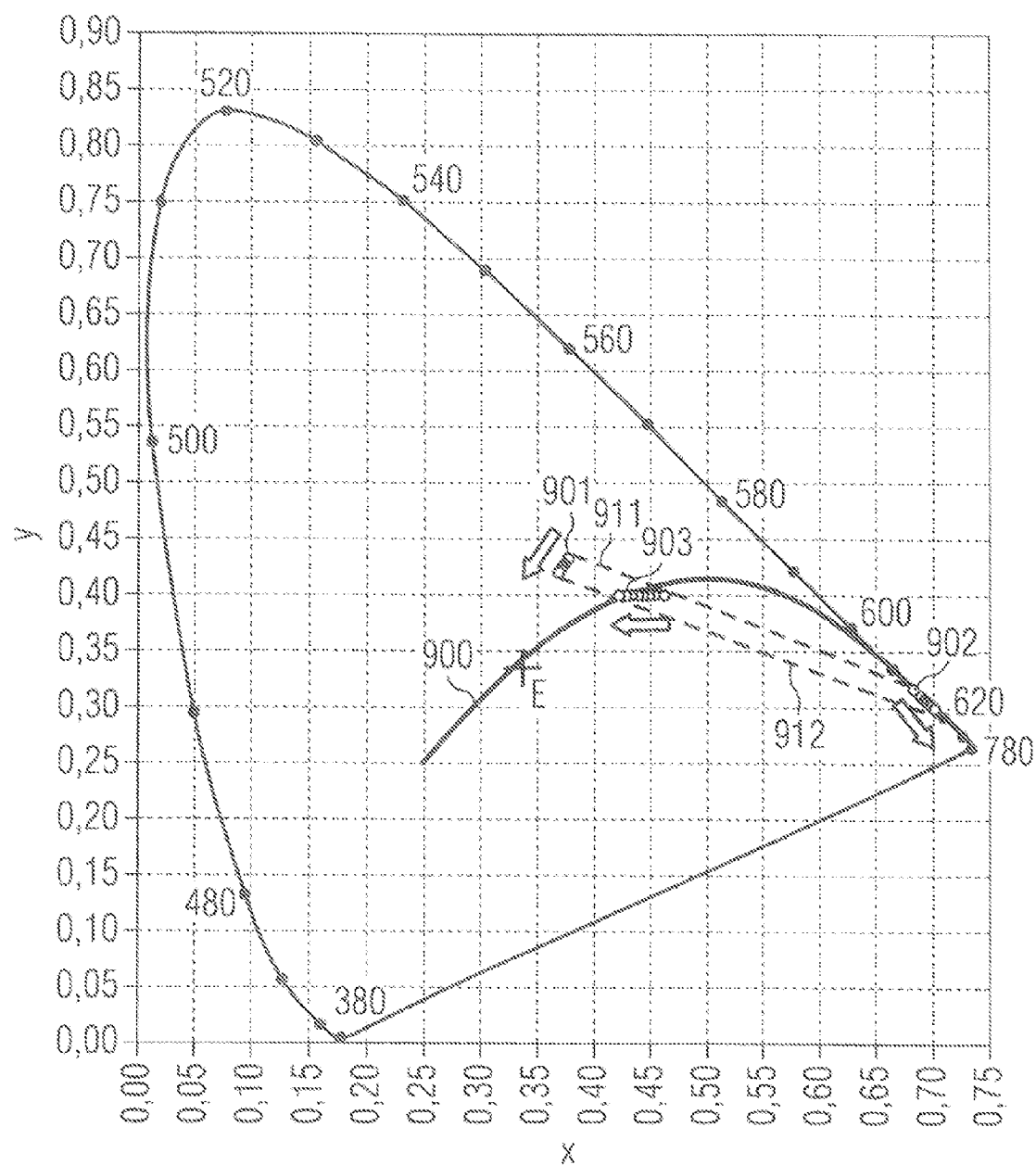

An optoelectronic device for emitting mixed light comprising light in a first and a second wavelength range may comprise, in particular:

a first semiconductor light source having a first light-emitting diode (LED), which during operation emits light in the first wavelength range with a first intensity, a second semiconductor light source having a second LED, which during operation emits light in the second wavelength range with a second intensity, wherein the first and second wavelength ranges are different from one another, and a resistance element having a temperature-dependent electrical resistance, wherein the first wavelength and/or the first intensity of the light emitted by the first semiconductor light source have/has a first temperature dependence, and the second wavelength range and/or the second intensity of the light emitted by the second semiconductor light source have/has a second temperature dependence, which is different from the first temperature dependence, the resistance element and the first semiconductor light source form a series circuit, and the series circuit and the second semiconductor light source form a parallel circuit.

Here and hereinafter, "light" can denote, in particular, electromagnetic radiation having one or a plurality of wavelengths or wavelength ranges from an ultraviolet to infrared spectral range. In particular, light can be visible light and comprise wavelengths or wavelength ranges from a visible spectral range with between approximately 350 nm and approximately 800 nm. Here and hereinafter, visible light can be characterizable for example by its color locus having x and y color locus coordinates in accordance with the so-called "CIE 1931 color locus diagram" or "CIE standard chromaticity diagram," which is known to those skilled in the art.

Here and hereinafter, white light or light having a white luminous or color impression can denote light having a color locus which corresponds to the color locus of a Planckian black-body radiator or deviates from the color locus of a Planckian black-body radiator by less than 0.1 and preferably by less than 0.05 in x and/or y color locus coordinates. Furthermore, a luminous impression designated here and hereinafter as a white luminous impression can be brought about by light having a color rendering index (CRI)—known to a person skilled in the art—of greater than or equal to 60, preferably of greater than or equal to 70, and particularly preferably of greater than or equal to 80.

Furthermore, here and hereinafter, "warm-white" can denote a luminous impression having a color temperature of less than or equal to 5500 K. Here and hereinafter, "cold-white" can denote a white luminous impression having a color temperature of greater than 5500 K. Here and hereinafter, the term "color temperature" can denote the color temperature of a Planckian black-body radiator or else the so-called "correlated color temperature (CCT)" which is known to those skilled in the art, in the case of a white luminous impression within the above-described meaning that can be characterized by color locus coordinates that deviate from the color locus coordinates of the Planckian black-body radiators.

Here and hereinafter, a first and a second luminous impression can be designated as "different" if the first luminous impression is brought about by light having a first color locus and the second luminous impression is brought about by light having a second color locus and the first color locus can be perceived as different from the second color locus. Different luminous impressions can be brought about, in particular, by mutually different first and second wavelength ranges. Here and hereinafter, a first and a second wavelength range can correspondingly be designated as different if, for instance, the first wavelength range has at least one spectral component which is not contained in the second wavelength range. In this case, it should be emphasized that a first and second wavelength range which are different from one another can indeed also have identical spectral components, as long as at least one of the two wavelength ranges has a spectral component that is not contained, or is not contained with the same relative intensity, in the other wavelength range, such that the first and second wavelength ranges bring about respective luminous and color impressions with different x and/or different y coordinates in the CIE standard chromaticity diagram.

Here and hereinafter, a first and second color locus or luminous impression are designated as being able to be perceived differently from one another if they can be perceived as different from one another by an average human observer. In particular, a first and second luminous impression with a first and second color locus are not different within the meaning of this application if the first and second color loci lie in the same MacAdams ellipse. The concept of MacAdams ellipses with regard to perceptibilities of color differences is known and will not be explained in any further detail here.

Particularly preferably, the resistance element can be in thermal contact with the first and/or second semiconductor light source and thus with the at least one first and/or second LED. As a result, thermal energy can be exchanged between the resistance element and at least the first and/or second semiconductor light source, such that the resistance element and at least the first and/or second semiconductor light source have the same or a similar temperature or have at least similar temperature changes in the event of changes in the ambient temperature or an operating temperature of at least one of the components of the optoelectronic device, that is to say, for example, of a semiconductor light source and/or of the resistance element. That can also mean, in particular, that the temperature of the resistance element in the event of a change in the temperature of the first and/or second semiconductor light source changes to the same extent as the temperature of the first and/or second semiconductor light source, and vice versa.

As a result of the different first and second temperature dependencies of the first and second intensities and/or the first and second wavelength ranges, the luminous impressions of the first and second semiconductor light sources can change differently from one another dependent on the ambient and operating temperature. In the case of an uncontrolled superimposition of the light from the first and second semiconductor light sources, therefore, the luminous impression of the superimposition, that is to say of the mixed light, can likewise change. In the case of the present optoelectronic device, the resistance element can make it possible to generate a mixed light having a least possible temperature dependence with regard to its color locus.

In contrast to my optoelectronic device, for the purpose of stabilizing the color locus, use is usually made of sensors together with control loops for controlling a plurality of LEDs. In this case, the sensors can be of optical nature or else reproduce the temperature of an LED. The sensor signals are then evaluated in the control loop for example with the aid of a microcontroller and for example also processed with the aid of tabulated data or other chip models to correspondingly control the LEDs. For this purpose, the LEDs are usually interconnected in different control circuits or control sections. However, in the case of such known techniques, under certain circumstances, electronic components susceptible to external interference are also used in complex and cost-intensive circuits. Furthermore, the sensor-dependent control loops are typically the most efficient under full load, while the control in the case of dimmed LEDs, which the control would entail, generally does not achieve the full efficiency.

In the case of the optoelectronic device described here, the resistance element is arranged in the main electric circuit, that is to say in the electric circuit by which the first and second semiconductor light sources are operated. By virtue of the fact that, in the case of the optoelectronic device described here, the resistance element is in thermal contact together with the first semiconductor light source and is interconnected in series therewith, the voltage dropped across the first semiconductor light source and the current flowing through the first semiconductor light source can be influenced directly by the resistance element. Therefore, the resistance element interconnected directly in the main electric circuit at the same time also constitutes the controlling element. By virtue of the second semiconductor light source being connected in parallel with the series circuit comprising the resistance element and the first semiconductor light source, the current flowing through the second semiconductor light source can furthermore also be influenced. In other words, the current balance in the parallel circuit, which forms the core element of the optoelectronic device, is influenced by the temperature characteristic curves of the first and second semiconductor light sources in combination with the temperature characteristic curve of the resistance element, which has a defined temperature dependence.

As a result, it is possible to bring about a temperature-dependent change in the first and second intensities which, for example, can counteract the first and second temperature dependencies of the first and second wavelength ranges, respectively, and/or the first and second intensities, respectively. In particular, it can be possible that the temperature-dependent variation of the color locus of the mixed light emitted by the optoelectronic device has a lower temperature dependence than is predetermined by the first and second temperature dependencies. A complex and fault-susceptible control loop such as is usually used can be obviated in the case of the present optoelectronic device.

An LED of a semiconductor light source, that is to say, for instance, the first and/or the second LED, can have, in particular, an epitaxial layer sequence, that is to say an epitaxially grown semiconductor layer sequence. In this case, the LED can be on the basis of InGaAlN, for example. InGaAlN-based LEDs and semiconductor layer sequences include, in particular, those in which the epitaxially produced semiconductor layer sequence generally has a layer sequence composed of different individual layers which contains at least one individual layer comprising a material from the III-V compound semiconductor material system $In_xAl_yGa_{1-x-y}N$ where $0 \leq x \leq 1$, $0 \leq y \leq 1$ and $x+y \leq 1$. Semiconductor layer sequences having at least one active layer based on InGaAlN can, for example, preferably emit electromagnetic radiation in an ultraviolet to green wavelength range.

Alternatively or additionally, the LED can also be based on InGaAlP, that is to say that the LED can have different individual layers, of which at least one individual layer comprises a material from the III-V compound semiconductor material system $In_xAl_yGa_{1-x-y}P$ where $0 \leq x \leq 1$, $0 \leq y \leq 1$ and $x+y \leq 1$.

Semiconductor layer sequences or LEDs which have at least one active layer based on InGaAlP can, for example, preferably emit electromagnetic radiation having one or more spectral components in a green to red wavelength range.

Alternatively or additionally, the semiconductor layer sequence or LED can also comprise other III-V compound semiconductor material systems such as, for instance, an AlGaAs-based material or a II-VI compound semiconductor material system. In particular, an LED comprising an AlGaAs-based material can be suitable for emitting electromagnetic radiation having one or more spectral components in a red to infrared wavelength range. A II-VI compound semiconductor material can comprise at least one element from the second main group or the second subgroup such as Be, Mg, Ca, Sr, Cd, Zn, Sn, for example, and an element from the sixth main group such as O, S, Se, Te, for example. In particular, a II-VI compound semiconductor material comprises a binary, ternary or quaternary compound comprising at least one element from the second main group or second subgroup and at least one element from the sixth main group. Moreover, such a binary, ternary or quaternary compound can comprise, for example, one or more dopants and additional constituents. By way of example, the II-VI compound semiconductor materials include: ZnO, ZnMgO, CdS, ZnCdS, MgBeO.

The semiconductor layer sequence of the first and/or of the second LED can furthermore have a substrate, on which the abovementioned III-V or II-VI compound semiconductor materials are deposited. In this case, the substrate can comprise a semiconductor material, for example a compound semiconductor material system mentioned above. In particular, the substrate can comprise sapphire, GaAs, GaP, GaN, InP, SiC, Si and/or Ge or be composed of such a material. The semiconductor layer sequence can have as active region, for example, a conventional pn junction, a double heterostructure, a single quantum well structure (SQW structure) or a multiple quantum well structure (MQW structure). In the context of the application, the designation quantum well structure encompasses, in particular, any structure in which charge carriers can experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures. The semiconductor layer sequence can comprise, alongside the active region, further functional layers and functional regions, for instance p- or n-doped charge carrier transport layers, that is to say electron or hole transport layers, undoped or p- or n-doped confinement, cladding or waveguide layers, barrier layers, planarization layers, buffer layers, protective layers and/or electrodes and also combinations thereof. Such structures concerning the active region or the further functional layers and the regions are known in particular with regard to construction, function and structure and will therefore not be explained in any further detail at this juncture.

The first and/or the second LED can, for example, also be thin-film light-emitting diode chips. A thin-film light-emitting diode chip is distinguished, in particular, by one or more of the following characteristic features:

a reflective layer is applied or formed at a first main area—facing toward a carrier element—of a radiation-generating epitaxial layer sequence, the reflective layer reflecting at least part of the electromagnetic radiation generated in the epitaxial layer sequence back into the latter;

the epitaxial layer sequence has a thickness in the range of 20 μm or less, in particular in the region of 10 μm; and/or the epitaxial layer sequence contains at least one semiconductor layer having at least one area having an intermixing structure which ideally leads to an approximately ergodic distribution of the light in the epitaxial layer sequence, that is to say that it has an as far as possible ergodically stochastic scattering behavior. The epitaxial layer sequence of a thin-film light-emitting diode chip can be transferred to a carrier substrate, embodied as a carrier element, after growth on a growth substrate by rebonding.

Furthermore, the first and/or the second semiconductor light source and hence the at least one first and/or second LED can bring about a mixed-colored and, in particular, a white luminous impression, for example. For this purpose, the first and/or second LED can comprise a wavelength conversion substance, which can be applied in the form of a potting or a surface coating on or above the epitaxial layer sequence of the first and/or second LEDs. The wavelength conversion substance can be suitable for converting at least part of the light emitted by an LED, which light can lie in an ultraviolet to blue spectral range, for instance, into longer-wave light, that is to say for instance into light having one or more spectral components in a green and/or a yellow and/or a red wavelength range. As a result of the emitted light being superimposed with the converted light, it is possible for a mixed-colored, for example white, luminous impression to be generated.

The wavelength conversion substance can comprise one or more of the following materials: garnets of the rare earths and of the alkaline earth metals, for example YAG:$Ce^{3+}$, nitrides, nitridosilicates, sions, sialons, aluminates, oxides, halophosphates, orthosilicates, sulfides, vanadates, perylenes, coumarin and chlorosilicates. Furthermore, the wavelength conversion substance can also comprise suitable mixtures and/or combinations thereof. Furthermore, the wavelength conversion substance can be embedded in a transparent matrix material that surrounds or contains the wavelength conversion substance. The transparent matrix material can comprise, for example, silicones, epoxides, acrylates, imides, carbonates, olefins or derivatives thereof in the form of monomers, oligomers or polymers as mixtures, copolymers or compounds therewith. By way of example, the matrix material can be an epoxy resin, polymethyl methacrylate (PMMA) or a silicone resin.

Furthermore, the light generated by the first and/or the second semiconductor light source or the first and/or second LED can be determined solely by the choice of the materials of the epitaxial layer sequences without the use of a wavelength conversion substance. By way of example, the first semiconductor light source can bring about a white luminous impression in combination with a wavelength conversion substance, while the second semiconductor light source can bring about a colored luminous impression. Thus, the first semiconductor light source can have, for example, a first LED based on InGaN, which emits light in a blue wavelength range. Furthermore, the first LED can comprise a wavelength conversion substance, which converts part of the blue primary light into green, yellow or yellow-green secondary light, such that the first wavelength range comprises blue and green, yellow or yellow-green spectral components and brings about a greenish-white to cold-white color impression. The second semiconductor light source can have a second LED based on InGaAlP, which emits light in a second, red wavelength range.

As a result of the superimposition of the light with the first and second wavelength ranges, depending on the desired weighting, a warm-white luminous impression can be brought about by the mixed light of the optoelectronic device. As an alternative thereto, the second semiconductor light source can also have a second LED based on InGaAlP, which generates light in a second, yellow wavelength range, such that the optoelectronic device can emit a mixed light with a cold-white luminous impression. In the case of such optoelectronic devices, a coarse preselection of the desired color locus can be possible at a predetermined ambient and operating temperature by the first semiconductor light source, while a fine setting or a "fine tuning" of the color locus is possible by the second semiconductor light source. Alternatively, the first and second semiconductor light sources can be arranged in an opposite way with regard to the above-described wavelength ranges and color impressions.

Furthermore, the first semiconductor light source and/or the second semiconductor light source can each have a plurality of first and/or second LEDs, respectively, which are embodied identically in each case.

Light-emitting diodes usually have a negative temperature dependence of the intensity at typical ambient and operating temperatures in the range of −40° C. to 125° C. That means that the intensity of the emitted light, with electrical conditions remaining the same, decreases as the ambient and operating temperature increases. Depending on the embodiment and choice of material of an LED, in this case the intensity of the light emitted by an LED can fall from 100% at a temperature of 0° C. to an intensity of less than or equal to 90% to greater than or equal to 10% at a temperature of 100° C.

Depending on the structure and choice of material, the first temperature dependence can be less than the second temperature dependence. That means that, as the temperature increases, by way of example, the first intensity of the first semiconductor light source changes to a lesser extent than the second intensity of the second semiconductor light source. In this case, the resistance element is a resistance element having a positive temperature coefficient. That means that the electrical resistance of the resistance element increases as the temperature increases and the resistance element is a so-called "PTC ("positive temperature coefficient") thermistor" or "PTC element." If the temperatures of the first and second semiconductor light sources increase for example as a result of an increase in the ambient temperature, then in the above-mentioned case the second intensity decreases to a greater extent than the first intensity. That means that the color locus of the mixed light would be shifted toward the color locus of the first semiconductor light source. By virtue of the resistance element embodied as a PTC element, however, at the same time the temperature also increases and therefore so does the electrical resistance as well, such that the current flowing through the series circuit and thus through the first semiconductor light source is reduced in comparison with the current flowing through the second semiconductor light source, such that the purely temperature-governed change in the first and second intensities can be counteracted.

As an alternative thereto, the first temperature dependence can be greater than the second temperature dependence. In this case, the resistance element is a resistance element having a negative temperature coefficient. That means that the electrical resistance of the resistance element decreases as the temperature increases and the resistance element is a so-called "NTC ("negative temperature coefficient") thermistor" or "NTC element." As a result, as in the previous case, the purely temperature-governed change in the first and second intensities can likewise be counteracted by virtue of the fact that, in the case of a temperature increase, the current flowing through the series circuit and thus through the first semiconductor light source is increased in comparison with the current flowing through the second semiconductor light source.

In particular, the resistance element can have a temperature-dependent electrical resistance adapted to the first and second temperature dependencies of the first and second semiconductor light sources, respectively. This can mean, in particular, that the resistance element does not have a switching behavior and that the electrical resistance does not change abruptly in a temperature range of −40° C. to 125° C. Preferably, the electrical resistance of the resistance element varies continuously in a temperature range of greater than or equal to −40° C. and less than or equal to 125° C.; that means that the electrical resistance, depending on the embodiment of the resistance element as a PTC thermistor or NTC thermistor, increases or decreases, respectively, with a temperature dependence substantially remaining the same. Preferably, the resistance element has a linear or approximately linear resistance-temperature dependence.

By way of example, a resistance element which is a PTC thermistor can comprise platinum or suitably doped silicon. A resistance element embodied as an NTC thermistor can comprise, for example, one or more oxides, for instance in the form of an oxide ceramic, comprising manganese, nickel, cobalt, iron, copper and/or titanium.

Furthermore, the optoelectronic device can have a third semiconductor light source, which is connected in series with the parallel circuit and which has at least one further LED. Preferably, the at least one further LED is at least one first LED. The third semiconductor light source can be suitable for setting the color locus of the mixed light of the optoelectronic device to a desired value at a preselected operating and ambient temperature. For this purpose, the third semiconductor light source can additionally or alternatively also have at least one third LED suitable for emitting during operation light in a third wavelength range, which is different from the first and second wavelength ranges. As a result of the series interconnection of the parallel circuit with the third semiconductor light source, the latter is substantially uninfluenced by the control by the resistance element in the parallel circuit. Consequently, in the case of the present optoelectronic device, a targeted temperature-dependent control of the first and second semiconductor light sources can be possible, while the third semiconductor light source is not actively controlled, but rather operated in a "freewheeling" fashion.

Furthermore, the optoelectronic device can have at least one electronic component suitable for setting the mixed light at a preselected ambient and operating temperature of the optoelectronic device. For this purpose, the electronic component can be integrated into the parallel circuit, that is to say be interconnected in series or in parallel with the parallel circuit, or else be an element of the third semiconductor light source. In this case, the electronic component can have one or a plurality of elements suitable for setting the current impressed on the first, second and/or, if appropriate, third semiconductor light source for a preselected operating and ambient temperature. The electronic component can be chosen from one or a plurality of fixed resistors, one or a plurality of variable resistors such as potentiometers, for instance, one or a plurality of transistors such as MOSFETs, for instance, and also combinations and interconnections thereof.

With the at least one electronic component and/or the third semiconductor light source, it is possible to set the mixed light for a specific ambient and operating temperature without the electronic component or the third semiconductor light source participating in the actual temperature-dependent control by the resistance element. The at least one electronic component can, in particular, also be suitable for setting the relative intensity ratio of the light emitted by the parallel circuit and the light emitted by the third semiconductor light source at a preselected temperature. Alternatively or additionally, if appropriate a setting of a relative intensity ratio of the first light-emitting diode and the third light-emitting diode in the third semiconductor light source at a predetermined temperature can be possible with an electronic component in the third semiconductor light source.

The optoelectronic device can have a housing or a printed circuit board, in which or on which the first semiconductor light source and the resistance element are arranged. The housing can comprise a plastic, in particular a thermoplastic or a thermosetting plastic. By way of example, the housing can be producible by a shaping process such as, for instance, transfer molding, injection molding, compression molding, cutting, sawing, milling or a combination thereof. In this case, the plastic can comprise siloxane and/or epoxide groups and can be embodied, for instance, as silicone, epoxy resin or a hybrid material composed of a mixture or a copolymer of silicone and epoxide. Alternatively or additionally, the plastic can also comprise polymethyl methacrylate (PMMA), polyacrylate, polycarbonate and/or imide groups.

The housing can have a depression, in which at least the first semiconductor light source is arranged and via which the light in the first wavelength range can be emitted. The resistance element can likewise be arranged in the depression or else alternatively thereto be enclosed by the housing material.

The housing can furthermore have a leadframe for making electrical contact with the first semiconductor light source and the resistance element. In this case, the leadframe can be integrated into the housing, wherein the housing body is molded around, surrounds and/or is potted around the leadframe. The leadframe can have one or a plurality of mounting regions on which the first semiconductor light source and the resistance element can be applied. In this case, the leadframe can have a plurality of electrical connection possibilities for making electrical contact with the first semiconductor light source and the resistance element, which are embodied for instance as bonding pads or as mounting areas. In this case, in particular, a series interconnection and also an electrical connection of the first semiconductor light source and of the resistance element to an external current and voltage supply can be possible with the mounting region or the mounting regions. The mounting region can be for example a mounting area on the leadframe.

Furthermore, the second semiconductor light source can also be arranged together with the first semiconductor light source and the resistance element in the same housing. As an alternative thereto, the optoelectronic device can have a first housing with the first semiconductor light source and the resistance element and additionally a second housing, in which the second semiconductor light source is arranged. In particular, the first housing and the second housing can then be in thermal contact with one another, such that a thermal coupling between the first and second LEDs and the resistance element can be present. If the optoelectronic device has a third semiconductor light source and/or at least one electronic component, then these can likewise be arranged in the same housing as the first semiconductor light source and the resistance element, alternatively thereto outside this or else in a further housing.

The first semiconductor light source can be in thermal contact with the resistance element via a heat conductor. By way of example, the heat conductor can comprise a material having good thermal conductivity such as copper, for instance. The heat conductor can for example also be formed by a leadframe of a housing. Furthermore, an electrical interconnection between the first semiconductor light source and the resistance element can also be made possible by the heat conductor. In this case, the resistance element can be embodied as a discrete electronic component. With the heat conductor, self-heating effects in the resistance element can be minimized and the resistance element can preferably have the same temperature as the first semiconductor light source. Furthermore, the second semiconductor light source can also be thermally coupled to the first semiconductor light source and the resistance element via the same heat conductor or a further heat conductor, such that particularly preferably the first semiconductor light source, the second semiconductor light source and the resistance element have the same temperature.

The first semiconductor light source can also be applied directly on the resistance element. For this purpose, the resistance element can be for example a carrier element, for instance as a so-called "submount". The electrical contact for the series circuit can thereby be formed directly via the connecting area between the resistance element and the first semiconductor light source.

Furthermore, the resistance element can also be a carrier substrate for one or a plurality of first LEDs of the first semiconductor light source. As a result, the resistance element can be integrated directly into the first semiconductor light source, such that an optimum thermal contact between the first LED or LEDs and the resistance element can be achieved. A silicon carrier substrate which is doped suitably with regard to the temperature-dependent conductivity and which at the same time is a PTC thermistor element can be particularly suitable for this purpose.

The optoelectronic device described here can be arranged, in particular, in such a way that a mixed light can be emitted which has, in a temperature range of greater than or equal to 0° C. and less than or equal to 100° C., and preferably of greater than or equal to −40° C. and less than or equal to 125° C., a temperature-dependent color locus shift by an average color locus, which shift runs along a major axis of a MacAdams ellipse around the average color locus. In this case, the color locus shift and the average color locus can be characterized by a first color locus of the mixed light emitted at a temperature of the optoelectronic device of 0° C., for example, and by a second color locus of the mixed light emitted at a temperature of 100° C., for example. The temperature-dependent color locus shift can then be characterizable to a first approximation by the connecting line between the first and second color loci. In this context, "along the major axis" means that the geometrical projection of the connecting line onto the major axis of the MacAdams ellipse is longer than the projection of the connecting line onto the minor axis of the same MacAdams ellipse. Particularly preferably, the connecting line and thus also the color locus shift of the mixed light run parallel or at least approximately parallel to the major axis of the associated MacAdams ellipse. Color locus shifts which run along the major axis of a MacAdams ellipse are more difficult to perceive than those which run with a numerically identical color locus coordinate difference along the minor axis of the MacAdams ellipse.

Further advantages will become apparent from the examples described below in conjunction with FIGS. 1 to 17.

In the examples and figures, identical or identically acting constituent parts can in each case be provided with the same reference symbols. The elements illustrated and their size relationships among one another should not be regarded as true to scale, in principle. Rather, individual elements such as, for example, layers, structural parts, components and regions may be illustrated with exaggerated thickness or size dimensions to enable better illustration and/or to afford a better understanding.

The following examples describe first semiconductor light sources 1 having at least one first LED 11 which brings about a cold-white to yellow-greenish luminous impression. For this purpose, as described in the general part, the at least one first LED 11 has purely by way of example a blue emitting epitaxial layer sequence based on InGaN, on which a yellow-green emitting wavelength conversion substance is applied. The CCT introduced in the general part is approximately in the range of 4000 to 5500 Kelvin. To generate warm-white mixed light emitted by an optoelectronic device, the second semiconductor light sources 2 described below having at least one second LED 21 which emits light in a second, red wavelength range are formed. However, on account of the typically wide emission bands of red emitting wavelength conversion substances, a large amount of power can lie in a wavelength range in which the eye sensitivity is very low, that is to say in a range of greater than or equal to approximately 640 nanometers. Preferably, therefore, no additional, for example red emitting wavelength conversion substance is used for the examples of optoelectronic devices described below.

In particular, the light having the second wavelength range is generated by the material of the epitaxial layer sequence of the at least one second LED 21 based on InGaAlP without the use of an additional red emitting wavelength conversion substance.

As a result of the use of second semiconductor light sources 2 and second LEDs 21 which can generate red light directly, the second wavelength range can be chosen better in the readily perceptible red wavelength range below 640 nanometers. As a result, for the optoelectronic devices described below, it is possible to achieve a high efficiency with at the same time a high color rendering value as a result of the combinations of the white emitting first semiconductor light sources 1 and red emitting second semiconductor light sources 2 shown.

As an alternative to the combinations—described here purely by way of example—with white emitting first semiconductor light sources 1 and directly red emitting second semiconductor light sources 2. However, it is also possible to use any other combination of first and second semiconductor light sources with emission spectra in other first and second wavelength ranges if some other color and luminous impression of the mixed light is desired.

FIG. 1A shows a CIE standard chromaticity diagram—known to those skilled in the art—with the color locus coordinate x on the horizontal axis and the color locus coordinate y on the vertical axis. In this case, the line 900 identifies the so-called "white curve"—known to those skilled in the art—of a Planckian black-body radiator at different temperatures thereof. These temperatures are also designated as color temperature. The cross E designates the (mathematical) white point having the color locus coordinates $x=y=\frac{1}{3}$, which corresponds approximately to a color temperature of 5500 Kelvin.

Furthermore, FIG. 1A identifies the color loci 901 for the above-described first LED 11 with the emission spectrum in the greenish-white first wavelength range for different ambient temperatures of 0° C. to 50° C. The arrow indicates the color locus change for increasing ambient temperatures of between 0° C. and 50° C. For the above-described second LED 21 with the emission spectrum in the red second wavelength range, the color loci 902 are depicted in the same temperature range of 0° C. to 50° C., in which case here, too, the color locus change for increasing ambient temperatures is indicated by the associated arrow.

Figure 3B:
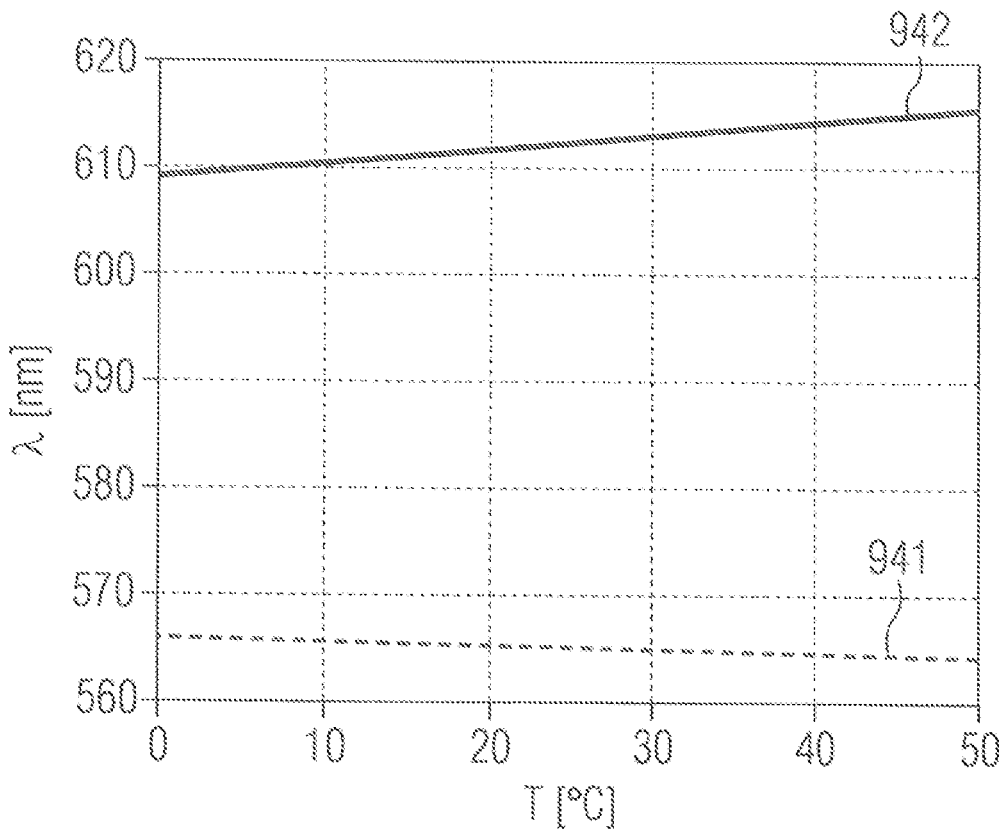

In addition to FIG. 1A, FIG. 3A furthermore shows the change—associated with the change in the ambient temperature T in degrees Celsius—in the first intensity for the first LED 11 by the curve 931 and in the second intensity for the second LED 21 by the curve 932 in relative units, a constant operating current for the LEDs in each case having been assumed here. The change in the respectively dominant wavelength λ (in nanometers) of the first and second wavelength ranges is furthermore also shown in FIG. 3B for the first LED 11 by curve 941 and for the second LED 21 by the curve 942 as a function of the ambient temperature T in degrees Celsius.

It can be discerned from FIGS. 3A and 3B that the second wavelength range of the second, red emitting LED 21 shifts toward higher wavelengths for increasing ambient temperatures and the emitted light simultaneously loses approximately 40% of intensity. In comparison therewith, the first wavelength range of the first LED 11 shifts toward somewhat shorter wavelengths, which is owing to the fact that the wavelength conversion substance of the first LED 11 becomes less efficient at higher temperatures. As a result, more unconverted, blue light can be emitted by the first LED. At the same time, the emitted first intensity of the first LED 11 decreases by less than 20%. In the example shown, therefore, the first LED 11 in comparison with the second LED 21 proves to be more temperature-stable and has a lower first temperature dependence of the first wavelength range and of the first intensity in comparison with the second temperature dependence of the second wavelength range and of the second intensity.

With in each case a constant operating current and an uncontrolled superimposition of the light emitted by the first LED 11 and the second LED 21 with the first and second temperature dependencies shown, this results in a temperature dependence of the resultant mixed light with the color loci 903 in FIG. 1A in the range indicated by the lines 901 and 902. In this case, it can be discerned that the luminous impression of the mixed light shifts from warm-white at an ambient temperature of 0° C. to cold-white at an ambient temperature of 50° C.

FIG. 2 shows an excerpt from the CIE standard chromaticity diagram from FIG. 1A in the range of the color locus coordinate x between 0.40 and 0.48 and in the range of the color locus coordinate y between 0.37 and 0.43, in which the temperature dependence of the color loci 903 of the uncontrolled mixed light can be discerned more clearly. Proceeding from this, the following examples are based on the consideration that, by a control of the ratio of the first intensity of the first LED 11 to the second intensity of the second LED 21, in the case of which here and hereinafter identical temperatures are assumed for all the LEDs, although no control to a single color locus 903 can be achieved owing to the respective temperature dependence of the first and second wavelength ranges, in the case of the optoelectronic devices described below it is possible to minimize the temperature dependence of the color loci 903 if the control brings about, for example, a color locus shift along the connecting line 920 between the color locus 921 at an ambient temperature of 0° C. and the color locus 922 at an ambient temperature of 50° C. In this case, the connecting line 920 is chosen such that it lies along the major axis of the MacAdams ellipse around the mid-point 923 of the connecting line 920. Some MacAdams ellipses enlarged approximately ten-fold are indicated for illustration purposes in the CIE standard chromaticity diagram in FIG. 1B. By control along the major axis of a MacAdams ellipse it is possible, as explained in the general part, to further minimize the perceptibility of the color locus change in the color loci 903 of the mixed light. In this case, the connecting line 920 illustrated in FIG. 2 is shown purely by way of example. As an alternative thereto, other connecting lines between a first point on the line 911 and a second point on the line 912 are also conceivable to achieve desired color locus dependencies of the mixed light by a corresponding control and compensation of the temperature-dependent change in the first and second intensities.

Figure 4:
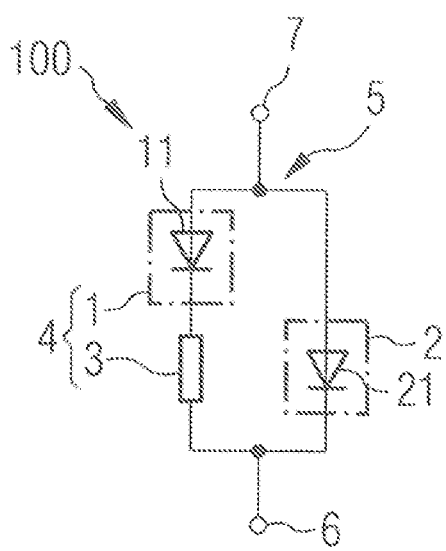

FIG. 4 shows an optoelectronic device 100 in accordance with one example. The optoelectronic device 100 has a first semiconductor light source 1 having a first LED 11 and a second semiconductor light source 2 having a second LED 21 in accordance with the description above. The first semiconductor light source 1 forms together with a resistance element 3, which has a temperature-dependent electrical resistance, a series circuit 4. The series circuit 4 forms together with the second semiconductor light source 2 a parallel circuit 5, which can be connected to an external current and voltage supply via electrical connections 6 and 7. In accordance with the previous description, the first semiconductor light source 1 has a first temperature dependence of the first intensity, which is less than the second temperature dependence of the second intensity. The resistance element is therefore a PTC element composed of silicon or platinum.

For the example shown, the connection of the second semiconductor light source 2 in parallel with the resistance element 3 which is a PTC element leads to an intensity stabilization of the light emitted by the second LED 21. At low ambient and operating temperatures, more current flows via the resistance element 3 and less through the second semiconductor light source 2, and at high temperatures, given a constant total current flow or constant voltage between the electrical connections 6 and 7, the current balance shifts toward the second semiconductor light source 2 since more current flows through the second semiconductor light source 2 as a result of a temperature-governed increase in the electrical resistance of the resistance element 3.

In the event of the second semiconductor light source 2 being connected in parallel only with the resistance element 3 alone. However, the full voltage dropped across the second semiconductor light source 2 would also be dropped across the resistance element 3, which would lead to high ohmic losses in the resistance element 3 and thus to an ineffective device. As a result of the additional series circuit 4 formed by connecting the resistance element 3 in series with the first semiconductor light source 1, it is possible to reduce the power loss at the resistance element 3, thus resulting in a significant increase in the efficiency of the optoelectronic device 100. At the same time as the increase in the current in the second semiconductor light source 2, the current flowing through the first semiconductor light source 1 is reduced by the resistance element 3 as the ambient temperature increases, such that, in comparison with a constant operating current for the first semiconductor light source 1, the current balance between first and second semiconductor light sources 1, 2 can be achieved by a comparatively smaller current increase in the second semiconductor light source 2. This in turn also has the consequence that current-governed self-heating effects in the second semiconductor light source 2 can be kept comparatively smaller, thus resulting in a smaller wavelength shift in the light emitted by the second LED 21 than would be possible in the case of solely controlling the operating current of the second semiconductor light source 2.

As an alternative to the example shown and also the following example, the resistance element 3 can also be an NTC element if the first and second semiconductor light sources 1, 2 are arranged such that the first temperature dependence of the first intensity is greater than the second temperature dependence of the second intensity. This is the case, for example, if the first semiconductor light source 1 has for this purpose a second LED 21 as described above, while the second semiconductor light source 2 has a first LED 11 as described above.

FIGS. 5 to 9 show examples of optoelectronic devices based on the optoelectronic device 100.

The optoelectronic device 101 in FIG. 5 has a housing 8, which, purely by way of example, is a surface-mountable housing. The housing comprises a plastic, for instance epoxide and/or silicone, and can be produced for example by a shaping process as described in the general part. Furthermore, the housing has a leadframe 81 for electrically connecting the optoelectronic device 101, the leadframe comprising the electrical connections 6 and 7. The plastic material of the housing 8 is molded around the leadframe 81 and the latter has a suitable connection topography to enable the series circuit 4 and the parallel circuit 5 (not shown).

The first and second semiconductor light sources 1, 2 and also the resistance element 3 which is a discrete component are arranged in a depression 82 of the housing 8. Furthermore, by way of example, a transparent plastic potting for the protection of the semiconductor light sources 1, 2 and of the resistance element 3 can be arranged (not shown) in the depression 82. As an alternative thereto, the resistance element 3 together with the leadframe 81 can also be encapsulated with the plastic material of the housing 8 during the production of the housing 8, while the semiconductor light sources 1, 2 are mounted in the depression 82 after the completion of the housing 8. As an alternative thereto, the semiconductor light sources 1, 2 and the resistance element 3 can also be mounted on the leadframe 81 and the plastic material of the housing 8 can subsequently be molded around them, wherein the housing 8 can then also be transparent and without a depression 82.

In the example shown, the first semiconductor light source 1 and the resistance element 3 and furthermore the second semiconductor light source 2 are in thermal contact through the housing 8 and the leadframe 81. In this case, the housing 8 and, in particular, the leadframe 81 act as a heat sink, which allow a uniform temperature distribution of the semiconductor light sources 1, 2 and of the resistance element 3. This is necessary to minimize self-heating effects and to expose the resistance element 3 as far as possible to the same temperatures as the semiconductor light sources 1, 2.

The optoelectronic device 101 has an extremely compact construction which, without further electronic control components such as are usually used in control circuits, enables a stabilization of the color locus of the mixed light emitted by the optoelectronic device 101 in the manner described above and below.

FIG. 6 shows an optoelectronic device 102 in accordance with a further example, which device can have the features of the previous example, but in comparison with the latter comprises a heat conductor 13, on which the first and second semiconductor light sources 1, 2 and the resistance element 3 are arranged. In this case, the heat conductor 13 is made from copper and permits the required series circuit 4 and parallel circuit 5 of the semiconductor light sources 1, 2 and of the resistance element 3 by a suitable spatial structuring. As an alternative thereto, the heat conductor 13 can also comprise other materials having high thermal conductivity and can, for example, also be integrated in the housing 8.

FIG. 7 shows a further optoelectronic device 103 in accordance with a further example, in which device, in comparison with the example in FIG. 5, the first semiconductor light source 1 is arranged directly on the resistance element 3. In this case, the resistance element 3 is embodied as a so-called "submount", which enables an electrical connection between the leadframe 81 and the first semiconductor light source 1. As a result, the series circuit 4 and at the same time a good thermal contact between the first semiconductor light source 1 and the resistance element 3 can be made possible in a simple manner.

Figure 8:
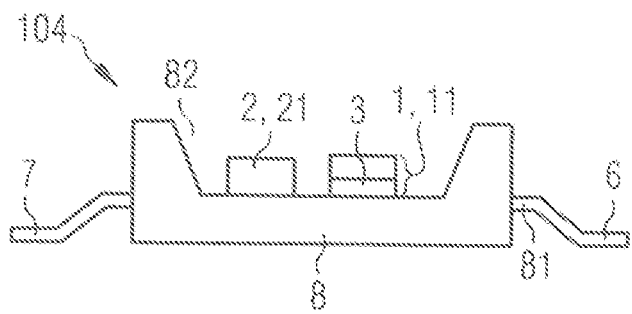

FIG. 8 shows a further optoelectronic device 104 in accordance with a further example, in which device the at least one first LED 11 of the first semiconductor light source 1 is a thin-film semiconductor chip in accordance with the description in the general part. As a carrier substrate, the first LED 11 has the resistance element 3 instead of the highly conductive thin-film carrier usually used, for instance composed of Ge, highly doped Si or GaAs. The resistance element 3 is thus integrated into the first semiconductor light source 1 and has an ideal because intrinsic thermal coupling of the resistance element 3 to the first semiconductor light source 1. On account of the integrated design, self-heating effects of the resistance element 3 can be disregarded in this case. Furthermore, it is not necessary to use an additional discrete component as resistance element 3, which can also lower the production costs. In particular, the resistance element 3 which is a carrier substrate can comprise suitably doped silicon having, instead of the highest possible conductivity usually desired for thin-film carriers, the temperature dependence of the electrical resistance that is desired here. As an alternative thereto, however, platinum as PTC material or, if appropriate, one of the NTC materials mentioned in the general part can also serve as a carrier substrate.

Figure 9:
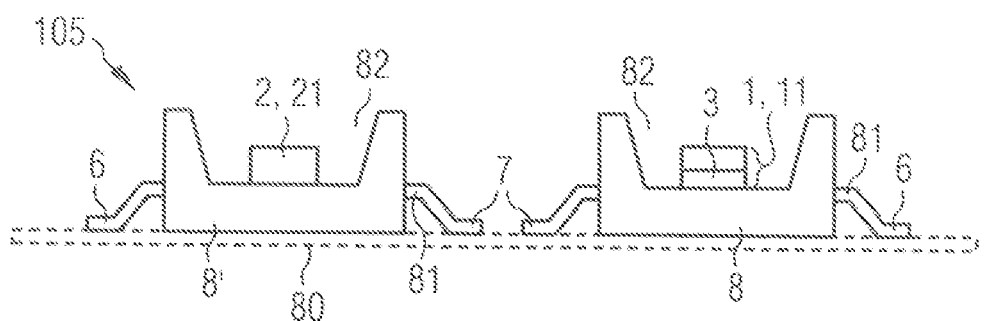

FIG. 9 shows an optoelectronic device 105 in accordance with a further example, which device, in comparison with the previous examples, has a first housing 8 with the resistance element 3 and the first semiconductor light source 1 and a second housing 8' with the second semiconductor light source 2. In this case, the first and second housings 8 and 8' can have features as explained in connection with the previous examples and in the general part. The housings 8 and 8' are arranged on the printed circuit board 80—indicated in a dashed fashion—and are thermally coupled to one another via the printed circuit board. By virtue of the printed circuit board 80 functioning as a heat sink, the first and second semiconductor light sources 1, 2 and also the resistance element 3 can have the same or at least a similar temperature. Furthermore, the housings 8 and 8' can, for example, also be thermally coupled to one another by an additional heat conductor. A high flexibility with regard to the combination and spatial arrangement of first and second semiconductor light sources 1, 2 can be made possible by the multi-housing embodiment of the optoelectronic device 105 shown.

In all the structural variants of the optoelectronic devices shown, it is also possible, for example, to classify the first and second LEDs 11, 21 with regard to their individual color loci and intensities in so-called "bins". The LEDs classified in this way can then be combined in a targeted manner with suitably chosen resistance elements 3 to obtain production series comprising optoelectronic devices having a mixed light that is as uniform as possible with regard to color locus, intensity and temperature dependence.

The following figures show optoelectronic devices in accordance with further examples which represent modifications and variations of the optoelectronic device 100. The description of the following examples is therefore restricted mainly to the differences and developments in comparison with the description above.

Figure 10:
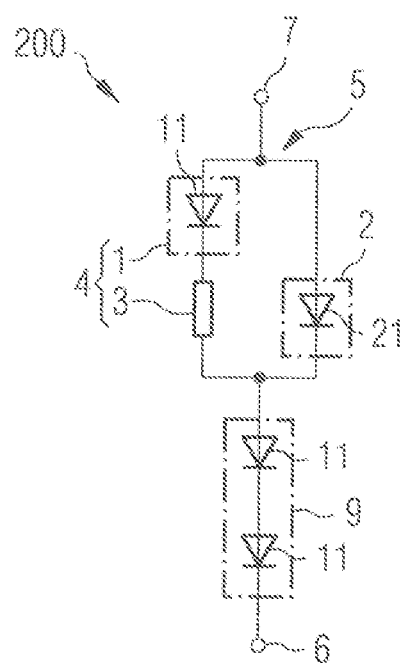

FIG. 10 shows an optoelectronic device 200 in accordance with a further example, which device has a third semiconductor light source 9, which is interconnected in series with the parallel circuit 5 in accordance with FIG. 4. In the example shown, the third semiconductor light source 9 has a plurality of further first LEDs 11, of which two are shown purely by way of example. With the third semiconductor light source 9, it is possible to set the color locus of the mixed light of the optoelectronic device 200 to a desired value at a preselected ambient and operating temperature. As a result of the series interconnection of the parallel circuit 5 with the third semiconductor light source 9, the current flow through the third semiconductor light source 9 for instance upon connection of a constant-current source to the electrical connections 6 and 7 is uninfluenced by the control by the resistance element 3 in the parallel circuit 5. Consequently, in the case of the optoelectronic device 200, a targeted temperature-dependent compensation of the temperature dependencies of the first and second semiconductor light sources 1, 2 can be possible, while the third semiconductor light source 9 is operated in a "freewheeling" fashion.

FIG. 11 shows an optoelectronic device 300, which, in comparison with the previous example, has a plurality of second LEDs 21 in the second semiconductor light source 2, of which two are shown purely by way of example. As a result, for a desired color impression of the mixed light of the optoelectronic device 300, it is possible to reduce the required operating current for the second LEDs 21, such that self-heating effects in the second LEDs 21 are also less pronounced in comparison with the previous example.

In the example shown, the resistance element 3 is composed of doped silicon, which, on account of its charge carrier mobility decreasing with higher temperatures, has the required PTC property, which can be represented by a resistance R(T) dependent on the ambient temperature T with the characteristic $$R(T)=R_0 \cdot (1+\alpha \cdot (T-T_0)+\beta \cdot (T-T_0)^2)$$

with the constants $\alpha=7.88 \cdot 10^{-3}/K$, $\beta=1.937 \cdot 10^{-3}/K^2$ and the room temperature $T_0=25°$ C., where $R_0$ is a resistance value that is variable by the doping at the room temperature $T_0$. Between 0° C. and 100° C., the resistance R(T) varies approximately by a factor of 2 with a virtually linear profile. The doping of the silicon is chosen such that at room temperature, that is to say 25° C., an electrical resistance of approximately 3 to 5 ohms arises which, in particular, can additionally be adapted with regard to the desired color temperature of the mixed light of the optoelectronic device and the characteristic curves of the first and second LEDs 11, 21.

To demonstrate the compensation and control behavior of the resistance element 3 with regard to the temperature dependence of the color locus of the mixed light emitted by the optoelectronic device 300, simulations were carried out, the results of which are shown in the following FIGS. 12 to 14 in excerpts from the CIE standard chromaticity diagram. The color locus shifts were investigated in an ambient temperature range of 0° C. to 50° C.

A resistance element 3 composed of silicon having the above-described temperature dependence of the electrical resistance R(T) was assumed for all the simulations. As a model for the temperature-dependent current-voltage characteristic curve with the current I in amperes, the voltage U in volts, the ambient temperature T in degrees Celsius and the resistances $R_{11}$ and $R_{21}$ in ohms, the following was assumed for the first LED 11

$$U_{11}=R_{11}\cdot I+2.902-(T-25)\cdot 0.004$$

and for the second LED 21

$$U_{21}=2\cdot(-0.07\cdot I^2+R_{21}\cdot I+1.85)-(T-25)\cdot 0.0025$$

Furthermore, the above-described temperature dependencies of the first and second wavelength ranges and of the first and second intensities and also the dependence thereof on the applied operating current I were taken into account.

In FIG. 12, $R_0=4$ ohms was assumed for the resistance element 3 and $R_{11}=0.879$ ohm and $R_{21}=1.76$ ohms were assumed for the first and second LEDs 11, 21, respectively. The points 951 (unfilled circles) represent the color locus shift on the basis of three points for the temperature range of between 0° C. and 50° C. along the direction identified by the arrow which, in contrast to the optoelectronic device 300, has no resistance element 3, although the same parameter values were assumed for the first and second LEDs 11, 21. The color locus shift 951 corresponds, apart from the smaller temperature range considered, to the color locus change in the color loci 903 shown in FIGS. 1A and 2. The points 952 (filled-in points), by contrast, correspond along the arrow shown to the color locus shift in the mixed light emitted by the optoelectronic device 300. The regulating and compensating effect of the resistance element 3 on the color locus of the emitted mixed light is readily discernible. In particular, with reference to FIGS. 1B and 2, a color locus shift along the major axis of a MacAdams ellipse is made possible for the optoelectronic device 300.

In FIG. 13, the resistance $R_0$ of the resistance element 3 was varied and is 3 ohms for the points 961 (unfilled circles), 4 ohms for the points 962 (filled points) corresponding to the points 952 in FIG. 12, and 5 ohms for the points 963 (unfilled quadrangles). In this case it can be discerned that the color locus region or the average white point to which stabilization is effected can be varied by the choice of the resistance $R_0$ of the resistance element 3, but the control and compensation properties remain unaffected thereby.

In FIG. 14, $R_0=4$ ohms was once again assumed, whereas the resistances $R_{11}$ and $R_{21}$ of the first and second LEDs 11, 21 were varied. The points 972 (filled-in points) once again correspond to the points 952 in FIG. 12, that is to say $R_{11}=0.879$ ohm and $R_{21}=1.76$ ohms. For the points 971 (unfilled circles), a resistance increased by 1 ohm, that is to say $R_{21}=2.76$ ohms, was assumed for the second LEDs 21, while for the points 973 (unfilled quadrangles) a resistance increased by 1 ohm, that is to say $R_{11}=1.879$ ohms, was assumed for the first LEDs 11. At an operating current of 350 milliamperes, as a result, in the case of the points 971 the operating voltage of the second LEDs at room temperature has increased from 2.1 volts to 2.28 volts, whereas in the case of the points 973 the operating voltage of the first LEDs at room temperature has increased from 3.21 volts to 3.56 volts. It can once again be discerned from FIG. 14 that, by adapting the resistances of the LEDs, although the color locus region or the average white point of the mixed light to which stabilization is effected can be varied, the control and compensation properties as a result of the resistance element 3 remain unaffected thereby.

Consequently, the optoelectronic device 300 can, for example, additionally also have an electrical component such as, for instance, a variable resistor, a fixed resistor or an active element such as a transistor, for instance, by which the average color locus of the mixed light can be fixedly set without influencing the control and compensation properties of the resistance element 3 in the parallel circuit 5.

In the case of the optoelectronic device 300 and also in the case of the optoelectronic devices in the other examples, the color locus of the luminous impression brought about by a superimposition of the light from the first and second semiconductor light sources 1, 2 can furthermore be characterized beforehand without the resistance element 3. Afterward, a resistance element 3 that is suitable with regard to its temperature-dependent electrical resistance can be added in a targeted manner with respect to the desired mixed light.

In the simulations shown for mixed light with a white point at a color temperature of approximately 3000 Kelvin, the result is a loss of efficiency through the use of the resistance element 3 under all expedient operating conditions of less than approximately 6% and in general even of less than 4% in comparison with a device without a resistance element 3. Although an ohmic loss source is introduced by the resistance element 3, for the optoelectronic devices described here it was thus surprisingly found that the losses can be kept acceptably small and a considerable color locus stabilization is possible in conjunction with simple technical outlay.

Figure 15:
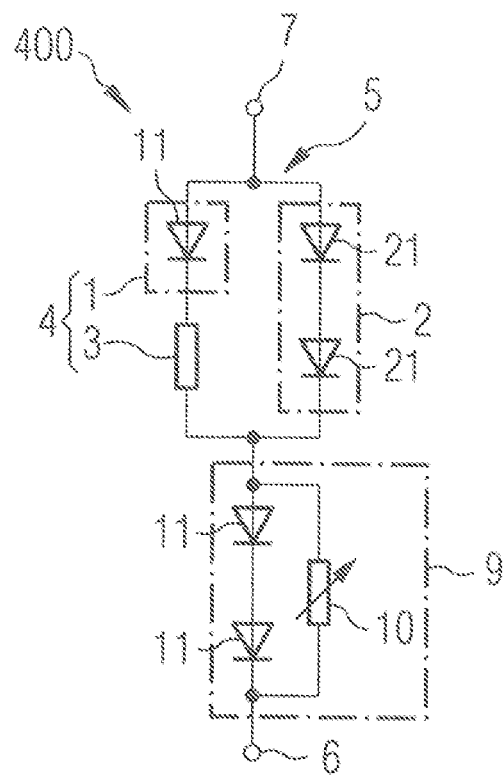
FIGS. 15 to 17 show schematic illustrations of still other optoelectronic devices.
Figure 16:
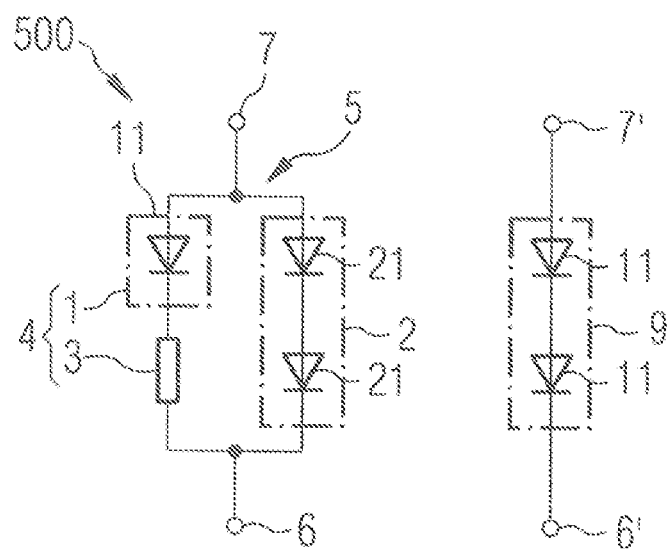
Figure 17:
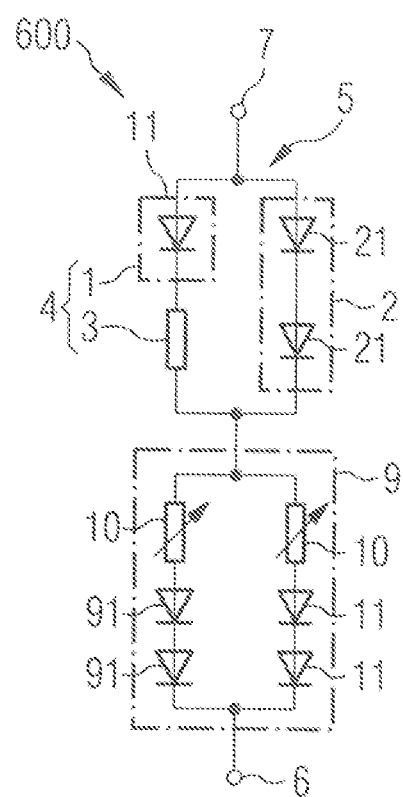

FIGS. 15 to 17 show further examples which represent further modifications and configurations of the previous examples.

The optoelectronic device 400 in accordance with FIG. 15 has, in comparison with the optoelectronic device 300, an electronic component 10 in the third semiconductor light source 9, the component being suitable for setting the mixed light at a preselected ambient and operating temperature of the optoelectronic device 400. In the example shown, the electronic component 10 has a variable resistor connected in parallel with the first LEDs 11 of the third semiconductor light source 9. Alternatively or additionally, the electronic component 10 can also have one or a plurality of further fixed resistors, variable resistors or transistors such as MOSFETs, for instance, which are suitable for setting the current impressed on the first, second and/or, if appropriate, third semiconductor light source for a preselected operating and ambient temperature and thus for setting an adjustment of the proportions with the first and second wavelength ranges in the mixed light.

FIG. 16 shows a further optoelectronic device 500, in which the third semiconductor light source 9 having the first LEDs 11 is connected up independently of the parallel circuit 5 via electrical connections 6' and 7'. A color locus adjustment of the mixed light with different circuit sections is thereby possible.

FIG. 17 shows an optoelectronic device 600 having a third semiconductor light source 9 having a parallel circuit comprising first LEDs 11 and third LEDs 91. The third LEDs 91 generate light having a third wavelength range, which is different from the first and second wavelength ranges. By way of example, the third LEDs 91, in comparison with the first LEDs 11, have the same epitaxial layer sequences in combination with less wavelength conversion substance, such that the third wavelength range, in comparison with the first wavelength range, brings about a white color impression having a higher color temperature or a higher blue proportion.

An electrical component 10 for setting the current in the two branches of the parallel circuit of the third semiconductor light source 9 is in each case arranged with respect to the first and third LEDs 11, 91. It is thereby possible to achieve an increased degree of freedom with regard to the setting of an average color locus of the mixed light emitted by the optoelectronic device 600. In the example shown with the first, second and third LEDs 11, 21, 91 described previously, the parallel circuit 5 thus enables a color locus stabilization with regard to temperature changes, while the third semiconductor light source 9 enables a fixedly selectable fine setting of the average white point of the mixed light. In the example shown with the abovementioned electrical specifications of the LEDs and of the resistance element 3, a total voltage of approximately 11 volts results for the optoelectronic device 600 given a total current of approximately 500 milliamperes, wherein, for an exemplary setting of the mixed light at room temperature, approximately 3.15 volts are present at the first LED 11 in the parallel circuit, approximately 4.2 volts are present at the second LEDs, approximately 0.5 volt is present at the electrical components of the third semiconductor light source 9, and approximately 3.15 volts are present at the first and third LEDs of the third semiconductor light source 9.

This disclosure is not restricted to the examples by the description on the basis thereof. Rather, the disclosure encompasses any novel feature and also any combination of features, which in particular includes any combination of features in the appended claims, even if the feature or combination itself is not explicitly specified in the claims or examples.

The invention claimed is:

1. An optoelectronic device that emits mixed light comprising light in a first and a second wavelength range, comprising:
   a first semiconductor light source having a first light-emitting diode, which during operation emits light in the first wavelength range with a first intensity;
   a second semiconductor light source having a second light-emitting diode, which during operation emits light in the second wavelength range with a second intensity, wherein the first and second wavelength ranges are different from one another; and
   a resistance element that is a thermistor which has a temperature-dependent electrical resistance with either a positive or a negative temperature coefficient, wherein
   the first wavelength range and the first intensity of the light emitted by the first semiconductor light source have a first and second temperature dependence, respectively; and
   the second wavelength range and the second intensity of the light emitted by the second semiconductor light source have a third and fourth temperature dependence, respectively, wherein the first temperature dependence is different from the third temperature dependence and/or the second temperature dependence is different from the fourth temperature dependence;
   the resistance element and the first semiconductor light source form a series circuit; and
   the series circuit and the second semiconductor light source form a parallel circuit;
   wherein the first light-emitting diode emits blue primary light and the first semiconductor light source comprises a wavelength conversion substance which converts part of the blue primary light into green, yellow or yellow-green secondary light such that the first wavelength range brings about a greenish-white to cold white color impression,
   the second light-emitting diode comprises InGaAlP, which emits light in a red wavelength range, and
   the first light-emitting diode and the second light-emitting diode are different, and
   wherein one branch of the parallel circuit comprises the thermistor and the other branch of the parallel circuit does not comprise any thermistor.

2. The device according to claim 1, wherein
   the first temperature dependence is less than the third temperature dependence; and
   the resistance element is a resistance element having a positive temperature coefficient.

3. The device according to claim 2, wherein the resistance element comprises platinum or silicon.

4. The device according to claim 1, wherein
   the first temperature dependence is greater than the third temperature dependence; and
   the resistance element is a resistance element having a negative temperature coefficient.

5. The device according to claim 1, wherein electrical resistance of the resistance element varies continuously in a temperature range of $-40°$ C. to $125°$ C.

6. The device according to claim 1, further comprising at least one electronic component that sets the mixed light at a predetermined temperature, wherein the at least one electronic component is a fixed resistor, a variable resistor or a transistor.

7. The device according to claim 1, wherein
   the parallel circuit is connected in series with at least one third semiconductor light source comprising one or more further light-emitting diodes, wherein the one or more further light-emitting diodes have a structure substantially identical to the first light-emitting diode of the first semiconductor light source.

8. The device according to claim 7, wherein the at least one third semiconductor light source has at least one electronic component that sets a relative intensity ratio of the at least one third semiconductor light source and the parallel circuit at a predetermined temperature.

9. The device according to claim 8, wherein
   the at least one third semiconductor light source has at least one third light-emitting diode, which during operation emits light in a third wavelength range, which is different from the first wavelength range; and
   the at least one electronic component sets a relative intensity ratio of the one or more further light-emitting diodes in the at least one third semiconductor light source and the at least one third light-emitting diode in the at least one third semiconductor light source at a predetermined temperature.

10. The device according to claim 1, wherein the resistance element is in thermal contact at least with the first semiconductor light source via a heat conductor.

11. The device according to claim 1, wherein the first semiconductor light source is applied directly on the resistance element.

12. The device according to claim 1, wherein the resistance element is a carrier substrate for the first light-emitting diode.

13. The device according to claim 1, wherein the optoelectronic device further comprises a housing containing the first and second semiconductor light sources and the resistance element.

14. The device according to claim 1, further comprising a first housing with the first semiconductor light source and the resistance element and a second housing with the second semiconductor light source, wherein the first and second housings are in thermal contact.

15. The device according to claim 1, wherein the mixed light in a temperature range of $0°$ C. to $100°$ C. has a temperature-dependent color locus shift by an average color locus, which shift runs along a major axis of a MacAdams ellipse around the average color locus.

16. The device according to claim 1, wherein the mixed light has a temperature dependence with regard to its color locus stabilized by interconnection of the resistance element with the first and second semiconductor light sources.

17. The device according to claim 1, wherein the first light-emitting diode comprises InGaN, which emits light in a blue wavelength range.

18. An optoelectronic device that emits mixed light comprising light in a first and a second wavelength range, comprising:
- a first semiconductor light source having a first light-emitting diode, which during operation emits light in the first wavelength range with a first intensity;
- a second semiconductor light source having a second light-emitting diode, which during operation emits light in the second wavelength range with a second intensity, wherein the first and second wavelength ranges are different from one another; and
- a resistance element that is a thermistor having a temperature-dependent electrical resistance with either a positive or a negative temperature coefficient, the resistance element being in thermal contact and interconnected in series with the first light source so that voltage dropped across the first semiconductor light source and current flowing through the first semiconductor light source are influenced directly by the resistance element, wherein
- the first wavelength range and the first intensity of the light emitted by the first semiconductor light source have a first and second temperature dependence, respectively; and
- the second wavelength range and the second intensity of the light emitted by the second semiconductor light source have a third and fourth temperature dependence, respectively, wherein the first temperature dependence is different from the third temperature dependence and/or the second temperature dependence is different from the fourth temperature dependence;
- the resistance element and the first semiconductor light source form a series circuit;
- the series circuit and the second semiconductor light source form a parallel circuit,
- wherein the first light-emitting diode emits blue primary light and the first semiconductor light source comprises a wavelength conversion substance which converts part of the blue primary light into green, yellow or yellow-green secondary light such that the first wavelength range brings about a greenish-white to cold white color impression, and the second light-emitting diode comprises InGaAlP, which emits light in a red wavelength range, and
- the first light-emitting diode and the second light-emitting diode are different, and
- wherein one branch of the parallel circuit comprises the thermistor and the other branch of the parallel circuit does not comprise any thermistor.

19. An optoelectronic device that emits mixed light comprising light in a first and a second wavelength range, comprising:
- a first semiconductor light source having a first light-emitting diode, which during operation emits light in the first wavelength range with a first intensity;
- a second semiconductor light source having a second light-emitting diode, which during operation emits light in the second wavelength range with a second intensity, wherein the first and second wavelength ranges are different from one another; and
- a resistance element that is a thermistor which has a temperature-dependent electrical resistance with either a positive or a negative temperature coefficient, wherein
- the first wavelength range and the first intensity of the light emitted by the first semiconductor light source have a first and second temperature dependence, respectively; and
- the second wavelength range and the second intensity of the light emitted by the second semiconductor light source have a third and fourth temperature dependence, respectively, wherein the first temperature dependence is different from the third temperature dependence and/or the second temperature dependence is different from the fourth temperature dependence;
- the resistance element and the first semiconductor light source form a series circuit; and
- the series circuit and the second semiconductor light source form a parallel circuit;
- wherein the first light-emitting diode emits blue primary light and the first semiconductor light source comprises a wavelength conversion substance which converts part of the blue primary light into green, yellow or yellow-green secondary light such that the first wavelength range brings about a greenish-white to cold white color impression, and the second light-emitting diode comprises InGaAlP, which emits light in a red wavelength range, and
- wherein the thermistor is present only in the branch of the parallel circuit comprising the first light-emitting diode and the other branch of the parallel circuit does not comprise any thermistor, and
- the first light-emitting diode and the second light-emitting diode are different.

\* \* \* \* \*